(12) United States Patent
Jaster

(10) Patent No.: US 10,785,861 B2
(45) Date of Patent: Sep. 22, 2020

(54) VIBRATION-RESISTANT CIRCUIT ARRANGEMENT FOR ELECTRICALLY CONNECTING TWO TERMINAL REGIONS

(71) Applicant: Continental Automotive GmbH, Hannover (DE)

(72) Inventor: Magnus Jaster, Kirchmöser (DE)

(73) Assignee: VITESCO TECHNOLOGIES GMBH, Hannover (DE)

(*) Notice: Subject to any disclaimer, the term of this patent is extended or adjusted under 35 U.S.C. 154(b) by 0 days.

(21) Appl. No.: 16/337,273

(22) PCT Filed: Sep. 5, 2017

(86) PCT No.: PCT/EP2017/072259
§ 371 (c)(1),
(2) Date: Mar. 27, 2019

(87) PCT Pub. No.: WO2018/065160
PCT Pub. Date: Apr. 12, 2018

(65) Prior Publication Data
US 2020/0037431 A1    Jan. 30, 2020

(30) Foreign Application Priority Data
Oct. 5, 2016   (DE) .......... 10 2016 219 309

(51) Int. Cl.
| H05K 1/02 | (2006.01) |
|---|---|
| H01F 27/10 | (2006.01) |
| H05K 7/20 | (2006.01) |
| B60R 16/03 | (2006.01) |
| H01F 27/20 | (2006.01) |

(Continued)

(52) U.S. Cl.
CPC .......... *H05K 1/0201* (2013.01); *B60R 16/03* (2013.01); *H01F 27/10* (2013.01); *H01F 27/20* (2013.01);
(Continued)

(58) Field of Classification Search
CPC .. H01F 5/003; H01F 17/0006; H01F 27/2804; H01F 2017/008
See application file for complete search history.

(56) References Cited

U.S. PATENT DOCUMENTS 3,319,206 A *   5/1967   Harloff ............... H03H 7/38
                                                     336/218
4,933,209 A *   6/1990   Anthony ............ G11B 5/3163
                                                     427/116
(Continued)

FOREIGN PATENT DOCUMENTS

DE   10 2004 058 806 A1   6/2006   ............. H01L 23/36
DE   10 2011 076 773 A1   12/2012  ............. H05K 3/14
(Continued)

OTHER PUBLICATIONS

International Search Report and Written Opinion, Application No. PCT/EP2017/072259, 16 pages, dated Dec. 7, 2017.

Primary Examiner — Robert J Hoffberg
(74) Attorney, Agent, or Firm — Slayden Grubert Beard PLLC

(57) ABSTRACT

Various embodiments include a circuit arrangement comprising: a heat sink; and a set of layers arranged on a surface of the heat sink. The set of layers includes a first electrically insulating insulation layer and an electrically conductive conductor layer arranged on a side of the insulation layer facing away from the heat sink. The set of layers includes an electrical connecting path between two electrical connection regions. At least one layer of the set of layers is formed by cold gas spraying of a respective material.

12 Claims, 4 Drawing Sheets

(51) Int. Cl.
*H01F 27/22* (2006.01)
*H01F 27/28* (2006.01)
*H01F 41/04* (2006.01)
*H05K 1/16* (2006.01)

(52) U.S. Cl.
CPC ......... *H01F 27/22* (2013.01); *H01F 27/2804* (2013.01); *H01F 41/041* (2013.01); *H05K 1/165* (2013.01); *H05K 7/209* (2013.01); *H05K 7/20854* (2013.01); *H05K 7/20863* (2013.01); *H05K 7/20872* (2013.01); *H05K 7/20918* (2013.01); *H05K 7/20927* (2013.01); *H01F 2027/2809* (2013.01); *H05K 2201/064* (2013.01); *H05K 2201/066* (2013.01); *H05K 2201/086* (2013.01); *H05K 2201/10053* (2013.01); *H05K 2201/10166* (2013.01); *H05K 2201/2045* (2013.01)

(56) References Cited

U.S. PATENT DOCUMENTS

| | | | | |
|---|---|---|---|---|
| 5,450,755 | A * | 9/1995 | Saito | H01F 17/0006 73/763 |
| 5,583,474 | A * | 12/1996 | Mizoguchi | H01F 17/0006 336/83 |
| 5,801,521 | A * | 9/1998 | Mizoguchi | H01F 17/0006 323/282 |
| 7,256,431 | B2 * | 8/2007 | Okamoto | C23C 28/345 257/177 |
| 7,876,561 | B2 * | 1/2011 | Schnetzka | F25B 49/025 180/297 |
| 8,378,877 | B2 * | 2/2013 | Tishin | C04B 38/02 342/1 |
| 2006/0108601 | A1 | 5/2006 | Okamoto | 257/177 |
| 2006/0219709 | A1 | 10/2006 | Kagan | 219/661 |
| 2008/0174393 | A1 | 7/2008 | Schnetzka et al. | 336/57 |
| 2009/0179721 | A1 | 7/2009 | Wernicki | 336/60 |
| 2017/0213648 | A1 * | 7/2017 | Joyce | H01L 21/6836 |
| 2019/0267207 | A1 * | 8/2019 | Jaster | H01H 85/0017 |

FOREIGN PATENT DOCUMENTS

| | | | |
|---|---|---|---|
| JP | 04133408 A * | 5/1992 | |
| JP | 2009076513 A * | 4/2009 | |
| JP | 2014-150283 A | 8/2014 | ............ H02M 3/00 |
| WO | 2018/065160 A1 | 4/2018 | ............ H01F 17/00 |

* cited by examiner

VIBRATION-RESISTANT CIRCUIT ARRANGEMENT FOR ELECTRICALLY CONNECTING TWO TERMINAL REGIONS

CROSS-REFERENCE TO RELATED APPLICATIONS

This application is a U.S. National Stage Application of International Application No. PCT/EP2017/072259 filed Sep. 5, 2017, which designates the United States of America, and claims priority to DE Application No. 10 2016 219 309.0 filed Oct. 5, 2016, the contents of which are hereby incorporated by reference in their entirety.

TECHNICAL FIELD

The present disclosure relates to electrical circuits. Various embodiments of the teachings herein may include circuit arrangements, in which two electrical connection regions are connected to one another by means of an electrical connecting path. Said connecting path is intended to be resilient to vibration-related breakage.

BACKGROUND

A circuit arrangement, as may be provided, for example, in a motor vehicle, must be resilient to vibrations in order that an electrical conductive element does not, for example, come loose from a solder connection or tear within itself or break in the case of vibrations. In this case, electrical coils of a power electronics system for operating an electric machine of a motor vehicle can constitute a particular problem, since such coils have a comparatively high inductance and have to conduct a high continuous current, which leads to a comparatively high amount of windings and heavy ferrites, with the result that they constitute a selective mass that can be excited into oscillation or swinging as a result of vibrations. In addition, a hotspot can develop in such a component in the case of high operating currents. DE 10 2011 076 773 A1 discloses the use of a cold gas spraying method for producing electrical connections in an integrated circuit (IC).

SUMMARY

The present disclosure describes vibration-resistant electrical connections between two connection regions, which connection can be cooled easily and permits a short link to semiconductors. For example, some embodiments include a circuit arrangement (15), having: a heat sink (17) and a layer arrangement (20), which is arranged on a surface (21) of the heat sink (17) and which has a first electrically insulating insulation layer (28) and an electrically conductive conductor layer (29) arranged on a side of the insulation layer (28) facing away from the heat sink (17), wherein an electrical connecting path (24) between two electrical connection regions (22, 23) is provided by the layer arrangement (20), characterized in that the layer arrangement is formed by cold gas spraying of a respective material of one or some or each of the layers (28, 29) of the layer arrangement (20).

In some embodiments, in order to set an electrical inductance value of the connecting path (24), the layer arrangement (20) has a magnetic layer (27), which is composed of a soft-magnetic material and arranged between the surface (21) of the heat sink (17) and the first insulation layer (28), and a second insulation layer (30) arranged on a side of the conductor layer (29) facing away from the first insulation layer (28), and also a second magnetic layer (31), wherein the conductor layer (29) is arranged between the first magnetic layer (27) and the second magnetic layer (31).

In some embodiments, the second magnetic layer (31) is connected (37) to the first magnetic layer (27) along a profile of the electrical connecting path (24) on both sides of the connecting path (24) or wherein the two magnetic layers (27, 31) are electrically insulated from one another by at least one of the insulation layers (28, 30).

In some embodiments, a further insulation layer is arranged between the heat sink (17) and the first magnetic layer.

In some embodiments, the soft-magnetic material of the first magnetic layer (27) and/or of the second magnetic layer (31) is porous.

In some embodiments, the layer arrangement (20) has between the second insulation layer (30) and the second magnetic layer (31) a further conductor layer and a third insulation layer insulating said further conductor layer from the second magnetic layer (31) and the two conductor layers (29) are inductively coupled by the first magnetic layer (27) and the second magnetic layer (31).

In some embodiments, the second insulation layer (30) is connected (36) to the first insulation layer (28) along the profile of the electrical connecting path (24) on both sides of the connecting path (24).

In some embodiments, the connecting path (24) is designed in a meander-shaped manner (32) or as a flat coil or, owing to a multilayer design of the layer arrangement (20), as a helix (34).

In some embodiments, at least one switchable electronic component (11) is arranged on the surface (21) of the heat sink (17), which switchable electronic component is electrically interconnected with one of the connection regions (22, 23).

In some embodiments, between the at least one component (11) and the layer arrangement (20), the surface (21) of the heat sink (17) has two material cutouts (25) and a bridge element (26) is formed by a part of the heat sink (17) arranged between the material cutouts (25).

In some embodiments, the circuit arrangement (15) is designed as a DC voltage converter or as an inverter.

In some embodiments, a cooling structure (18) is provided in or on the heat sink (17) in order to guide a cooling medium (19).

As another example, some embodiments include a motor vehicle (10) having an electrical voltage source (13) and having at least one high-current load (11) which has an operating current (14) greater than 10 A, characterized in that the voltage source (13) and the at least one high-current load (11) and a circuit arrangement (15) as described above are electrically connected to one another.

As another example, some embodiments include a method for producing a circuit arrangement (15), wherein a layer arrangement (20) composed of an insulation layer (28) made of an electrically insulating material and a conductor layer (29) made of an electrically conductive material arranged on a side of the insulation layer (28) facing away from the heat sink (17) is produced on a surface (21) of the heat sink (17) by means of cold gas spraying, wherein an electrical connecting path (24) between two connection regions (22, 23) is provided by the layer arrangement (20).

BRIEF DESCRIPTION OF THE DRAWINGS

Exemplary embodiments of the teachings herein is described below. In this regard, in the figures.

DETAILED DESCRIPTION

Figure 1:
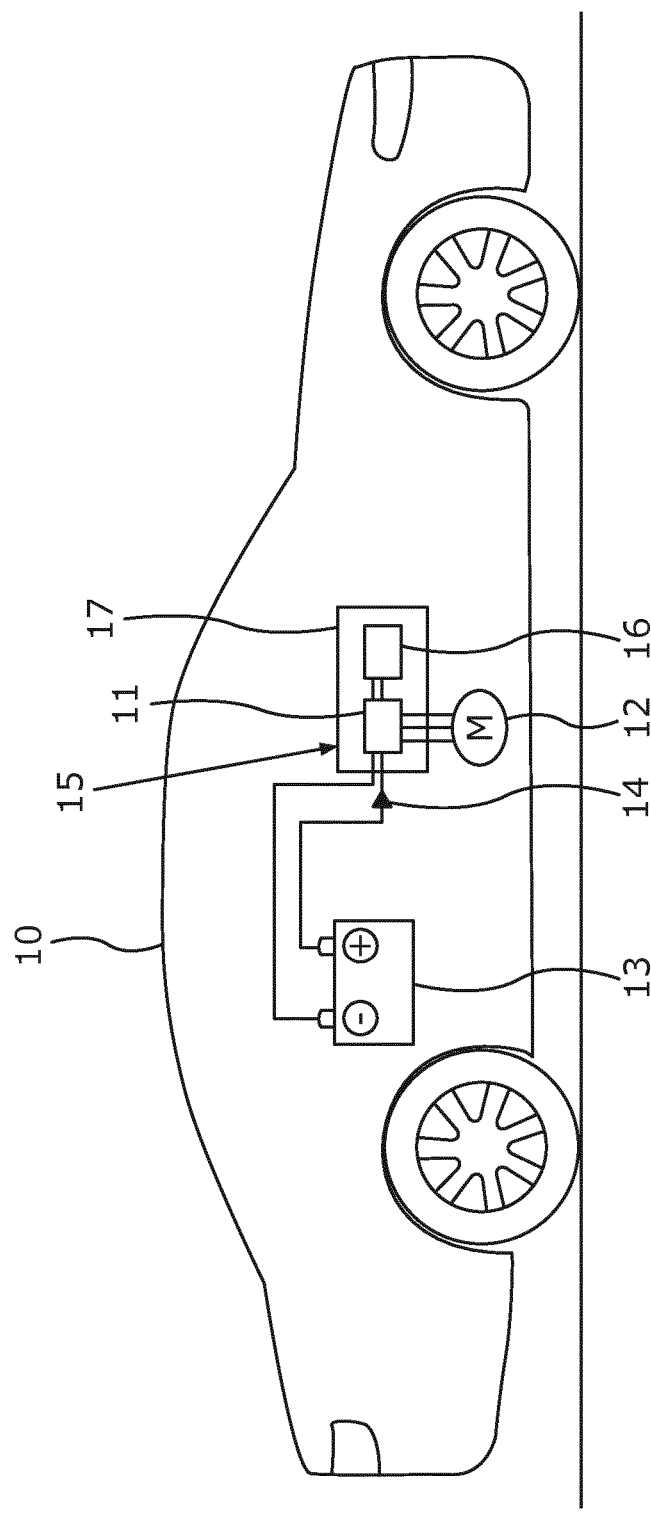
FIG. 1 shows a schematic illustration of an embodiment of the motor vehicle incorporating the teachings of the present disclosure.

The teachings of the present disclosure may be embodied in a circuit arrangement, by way of which an electrical connecting path or current path between two electrical connection regions is provided. Connection region in this case means a contact region or transition region by means of which the circuit arrangement can be electrically connected to further circuit elements or circuit parts. The circuit arrangement has a heat sink, on the surface of which a layer arrangement is provided in order to provide the connecting path. The layer arrangement is formed by cold gas spraying of a respective material of one or some or each of the layers of the layer arrangement. The heat sink can also be provided as a heat-conducting body for coupling the layer arrangement to another component in order, for example, to heat in a targeted manner either the layer arrangement or the other component, for example in winter.

In some embodiments, the layer arrangement has an electrically insulating layer, which is referred to here as insulation layer. The heat sink can be formed from a metal, for example aluminum or an aluminum alloy. The insulation layer insulates a conductor layer with respect to the heat sink. Said conductor layer is thus arranged on a side of the insulation layer facing away from the heat sink and is formed from an electrically conductive material. In connection with the invention, electrically insulating means that an electrical conductivity is lower than $10^{-5}$ S/m, in particular lower than $10^{-6}$ S/m. In connection with the invention, electrically conductive is to be understood to be a conductivity greater than 10 000 S/m, in particular greater than 100 000 S/m.

In some embodiments, the electrical connecting path is thus formed in a planar manner by the layer arrangement or on a heat sink by lamination or coating. As a result thereof, the connecting path or the conductor layer is reinforced or supported by the heat sink so that the layer arrangement cannot perform a natural oscillation in the case of excitation owing to vibrations. Furthermore, the planar configuration as a layer arrangement promotes the delivery of a heat output from the conductor layer into the heat sink. To provide the conductor layer, copper or aluminum or an aluminum alloy, for example, can be provided as material. The insulation layer can be formed, for example, on the basis of a ceramic or aluminum oxide.

In some embodiments, a method includes producing the described circuit arrangement by means of cold gas spraying. In other words, the material of the insulation layer and of the conductor layer is provided in each case in the form of pellets or a powder and is applied to the heat sink or arranged there by means of cold gas spraying. In some embodiments, the layer arrangement having the insulation layer made of the electrically insulating material and the conductor layer made of an electrically conductive material arranged on the side of the insulation layer facing away from the heat sink may be produced on the surface of the heat sink by means of cold gas spraying. The electrical connecting path between the connection regions is provided here by the layer arrangement. To this end, it is possible to stipulate, for example by means of a mask or pattern on the heat sink, where the material of the insulation layer and the material of the conductor layer arranged thereon is applied or arranged. In this case, the conductor layer is, in particular, at least 0.5 cm, in particular at least 1 cm wide and/or the connecting path is at least 2 cm long. Said conductor layer is thus not a microstructure of an integrated circuit on a substrate. The thickness can be up to a few μm thin.

The width and/or the length can be greater than 0.75 mm. However, it is still not an integrated circuit.

As already described, an inductance constitutes, in particular, a critical component in relation to the susceptibility to natural oscillations in the case of vibrations. In some embodiments, in order to set an electrical inductance value of the connecting path, the layer arrangement may have two further layers, which are referred to here as magnetic layers. One of the magnetic layers is arranged between the surface of the heat sink and the first insulation layer. This magnetic layer is thus arranged on the surface of the heat sink and holds the insulation layer. The second magnetic layer is provided to cover the conductor layer. In order that a current does not undesirably flow through the magnetic layer here, a second insulation layer made of an electrically insulating material is first arranged on the conductor layer on the side of the conductor layer facing away from the first insulation layer. The second magnetic layer is then arranged on the side opposite the first magnetic layer with respect to the conductor layer. However, the first magnetic layer and the second magnetic layer touch one another at the edges so that they form a sleeve or a closed shell around the conductor layer and the two insulation layers. As an alternative, a gap can also be provided in a targeted manner by virtue of one of the insulation layers separating the two magnetic layers.

A closed magnetic circuit made of soft-magnetic material is therefore produced in cross section perpendicularly to a profile or a longitudinal direction of the electrical connecting path. In other words, the second magnetic layer is connected to the first magnetic layer along a profile of the electrical connecting path on both sides of said connecting path. Each magnetic layer is formed from a soft-magnetic material, for example iron or an iron alloy. Soft-magnetic means here that the material is ferromagnetic and has a coercive field strength with a value of less than 1000 A/m. Owing to their touching along the connecting path, the two magnetic layers therefore form a soft-magnetic shell around the conductor layer, as a result of which the inductance value of the conductor layer is increased. The inductance value can be set by selecting the thickness of the magnetic layers and/or by selecting the soft-magnetic material.

In some embodiments, an additional insulation layer can be provided between the heat sink and the first magnetic layer in order, for example, to block eddy currents.

In some embodiments, the soft-magnetic material of the first magnetic layer and of the second magnetic layer may be porous. A porous structure, that is to say in which air is arranged between the soft-magnetic material, replaces a discrete air gap in order to set the inductance value.

A further parameter for setting the inductance value is the length of the electrical connecting path. In order to set a connecting path with a prescribed length on a given area, the connecting path may be designed in a meander-shaped manner or as a flat coil, that is to say in a spiral-shaped manner in a plane, or, owing to a multilayer design of the layer arrangement, as a helix, that is to say as a spiral running spatially or helically.

In some embodiments, the layer arrangement may comprise a transducer or a transformer. In some embodiments, a further conductor layer and a further insulation layer electrically insulating said conductor layer from the second magnetic layer may be arranged between the second insulation layer, which thus lies on the conductor layer, and the second magnetic layer, which bounds the entire layer arrangement with respect to the environment. That is to say two conductor layers, which are electrically insulated from one another by the second insulation layer and from the two magnetic layers by the first insulation layer and by the third insulation layer, then run in the layer arrangement parallel to one another. The two conductor layers are hence inductively coupled by the first magnetic layer and the second magnetic layer.

In some embodiments, the heat sink is not only used as a carrier element or reinforcing element and cooling system for the layer arrangement alone but also for reinforcing and/or cooling a larger circuit structure. To this end, at least one switchable electronic component, for example a transistor, may be arranged on the surface of the heat sink. The component is then electrically connected at one of the connection regions or interconnected therewith so that the layer arrangement and the at least one electronic component first produce an overall electrical circuit.

In order to thermally decouple the at least one electronic component from the layer arrangement, in particular the layer arrangement having a magnetic layer, between the at least one component on the one hand and the layer arrangement on the other hand, for the surface of the heat sink may have at least two material cutouts and a bridge element is produced between in each case two of the material cutouts, by means of which bridge element the layer arrangement is electrically connected to the at least one component. Owing to the material cutouts, a cavity or an air space is produced on the right and on the left next to each bridge element so that, in the material of the heat sink, heat losses cannot diffuse or be conducted on the right and on the left past the bridge element but only within the bridge element between the at least one component on the one hand and the layer arrangement on the other hand. The material cutouts therefore constitute a thermal decoupling.

In some embodiments, the circuit arrangement is produced using a cold gas spraying method. In other words, the layers of the layer arrangement, that is to say the insulation layer and the conductor layer and the further described layers, are all or at least one or some of said layers are produced in each case by cold gas spraying. This means that a material of the respective layer is applied as a powder or pellets and, in this case, the particles of the powder or pellets are meshed with one another and/or partly melted together, that is to say are melted together at contact surfaces. The material of each layer thus forms in each case, in particular, a porous or punched structure.

The circuit arrangement having the layer arrangement and the at least one component may comprise a DC voltage converter or as an inverter. Such an electric machine can therefore be operated, in particular in a motor vehicle or generally in a vibrating environment, as can be caused, for example, during operation of an electric machine, by means of the circuit arrangement.

In order to increase a cooling power, which is effective at the layer arrangement, a cooling channel or generally a cooling structure may be provided in or on the heat sink in order to guide a cooling medium. The heat sink can therefore be flushed, for example, with water or oil as cooling medium or cooling air can be supplied.

The motor vehicle may include an electrical voltage source, for example an electrical battery, in particular a traction battery, electrically connected to at least one high-current load and to one embodiment of the circuit arrangement described herein. In this case, an electrical load having an operating current greater than 10 A is considered as a high-current load. Such a high-current load can be, for example, an electric machine, which can be provided, for example, for driving mode or traction drive of the motor vehicle. For example, an equalization circuit for equalizing different potentials can thus also be realized.

In reference to the figures, the described components of the embodiment each represent individual features of the teachings herein which are to be considered independently of one another and which each also develop the principles independently of one another and can therefore also be considered to be a component of the teachings, either individually or in a combination other than that shown. Furthermore, further features that have already been described can also be added to the described embodiment. In the figures, functionally identical elements are each provided with the same reference symbols.

FIG. 1 shows a motor vehicle 10, which may be, for example, an automobile, in particular a passenger vehicle or a truck. The motor vehicle 10 can have a high-current load 11, which, in the example shown, can be an inverter of an electric machine 12. A traction drive for the motor vehicle 10 can be provided, for example, by means of the electric machine 12. To operate or supply power to the high-current load 11, it can be electrically connected to a voltage source 13, which, in the example shown, can be a battery, for example a traction battery or high-voltage battery. An operating current 14 for the high-current load 11 can be greater than 10 A, in particular greater than 50 A.

To reduce a ripple of a time profile of the operating current 14 and/or for DC voltage conversion, an inductance 16 can be provided in the circuit arrangement 15. The circuit arrangement 15 can have a heat sink 17, on which the inductance 16 and the high-current load 11 can be arranged together, that is to say electronic components of the high-current load 11 can be integrated into the circuit arrangement 15. The inductance 16 is distributed in a flat or planar manner and also reinforced by the heat sink 17. In the case of vibrations during travel of the motor vehicle 10, the inductance 16 can therefore not be excited or escalated into natural oscillation by the vibrations. In addition, uniform cooling, that is to say prevention of hotspots, is ensured.

Figure 2:
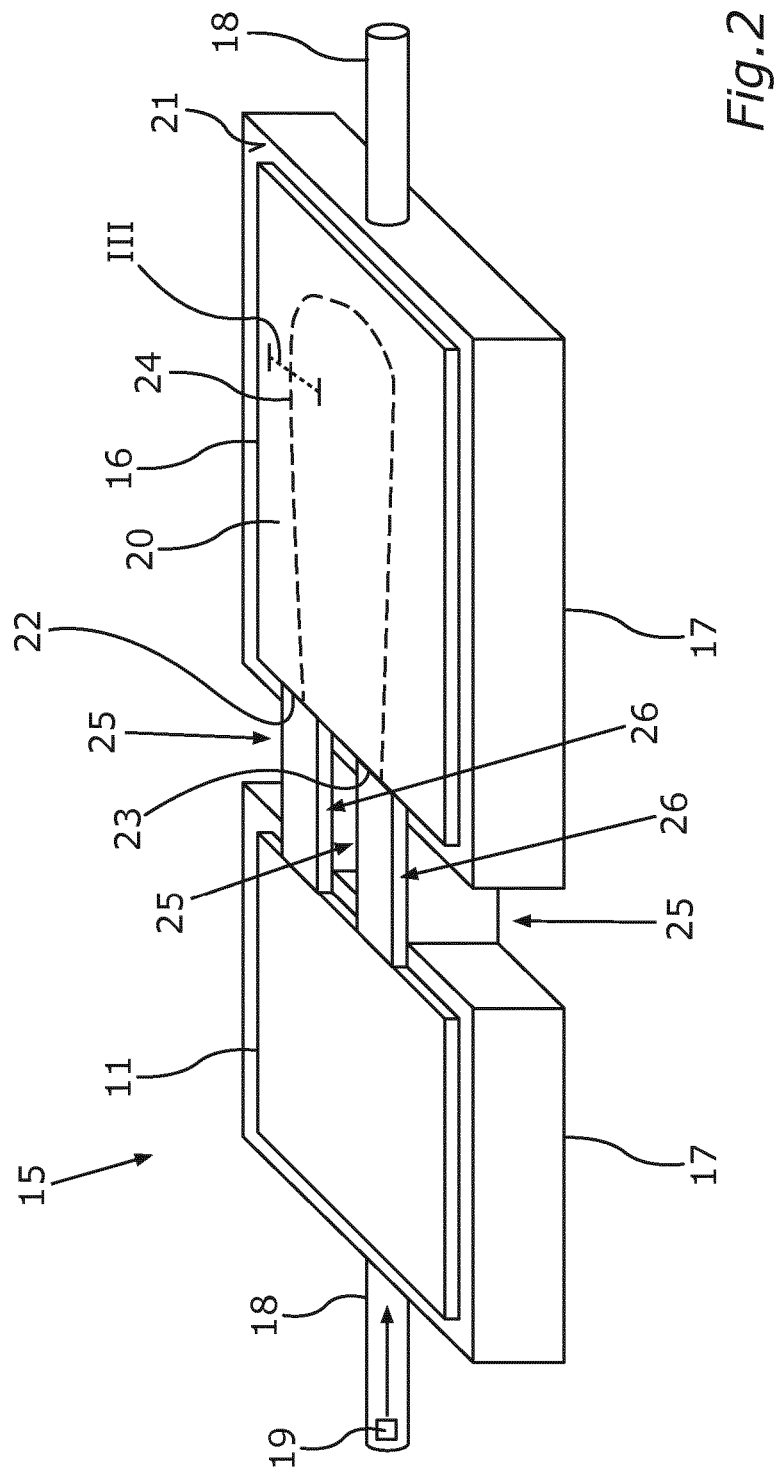
FIG. 2 shows a schematic illustration of a perspective view of an embodiment of the circuit arrangement incorporating the teachings of the present disclosure, which can be provided in the motor vehicle of FIG. 1.

FIG. 2 illustrates the planar or flat configuration of the inductance 16. FIG. 2 shows the heat sink 17, which may be, for example, an injection-molded component. A material of the heat sink 17 can comprise, for example, aluminum or an aluminum alloy. By means of a cooling structure 18, a cooling medium 19 for transporting away or dissipating thermal energy from the heat sink 17 can be led or guided or streamed through or past said heat sink. The cooling structure can provide, for example, a cooling channel and/or cooling ribs.

The inductance 16 is formed by a layer arrangement 20, which can be arranged on a surface 21 of the heat sink 17. The layer arrangement 20 has an electrically conductive part so that a first connection region 22 and a second connection region 23 can be electrically connected by means of the layer arrangement 20 and, as a result thereof, an electrical connecting path 24 between the connection regions 22, 23 is produced for the operating current 14.

The layer arrangement 20 is only marginally thermally coupled to the high-current load 11 despite the common heat sink 17. To this end, the heat sink 17 can have material cutouts 25 on the surface 21 thereof, said cutouts being able to be produced, for example, during production of the heat sink 17 by way of an appropriate mold and/or by milling or drilling. Owing to the respective remaining part of the heat sink 17 between in each case two of the material cutouts 25, a bridge element 26 is formed by means of which the layer arrangement 20 can be electrically connected to the high-current load 11.

The inductance 16 is provided along the connecting path 24 by the layer arrangement 20 and the heat sink 17. A plurality of electrically isolated connecting paths 24 and a plurality of inductances 16 can also be provided by the layer arrangement 20, which is possible by accordingly providing the following structures in multiple.

Figure 3:
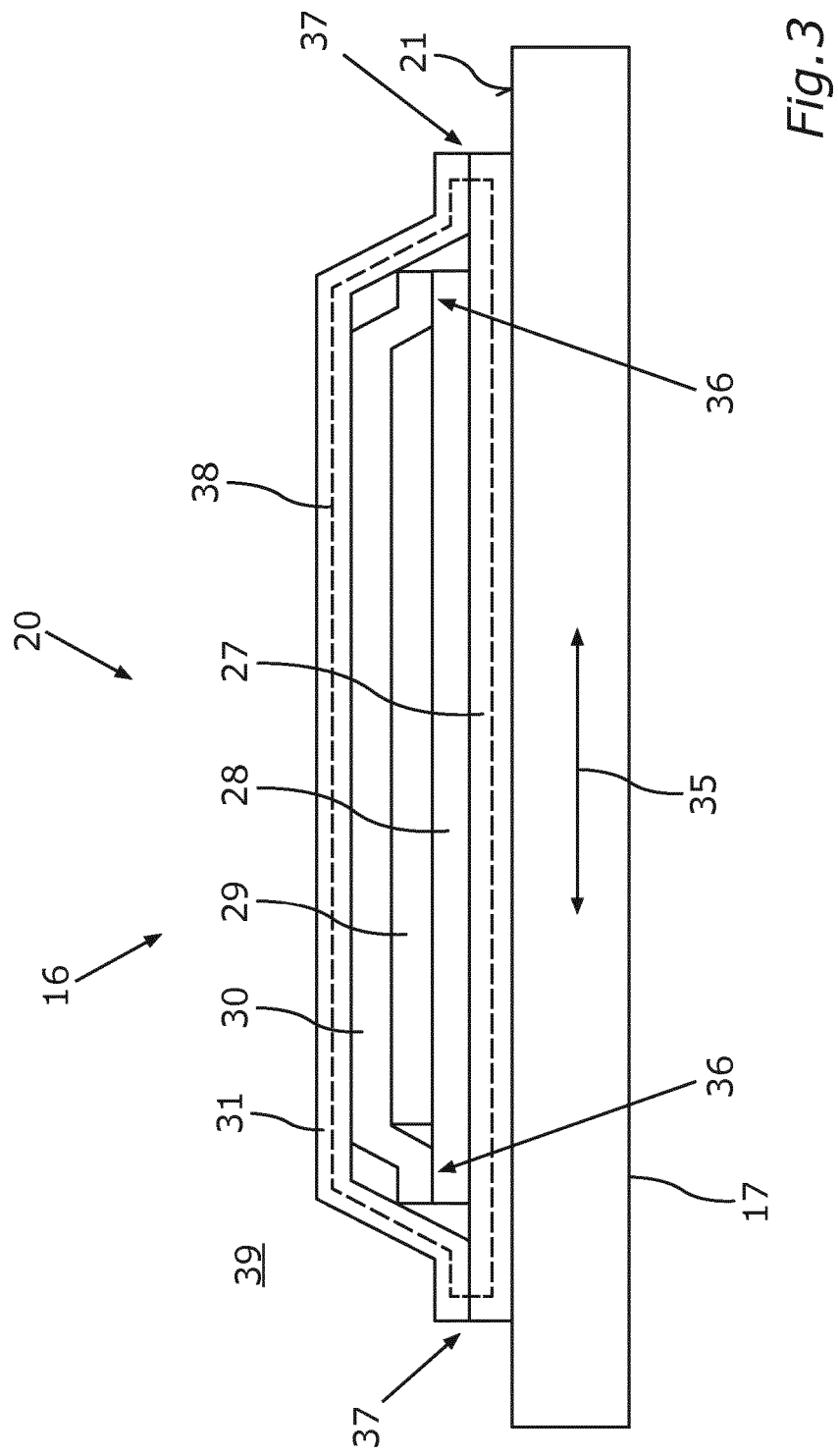
FIG. 3 shows a schematic illustration of a cross section of the circuit arrangement from FIG. 2.

FIG. 3 illustrates a cross section perpendicular to the profile of the connecting path 24. The sectional line for the section according to FIG. 3 is denoted in FIG. 2 as III. Proceeding from the heat sink 17, in the illustrated example, a first magnetic layer 27, a first insulation layer 28, a conductor layer 29, a second insulation layer 30 and a second magnetic layer 31 are arranged in this order on the surface 21 of said heat sink. The layers 27, 28, 29, 30, 31 together constitute the layer arrangement 20. The layer arrangement 20 can be applied to the surface 21 of the heat sink 17 in a coating process. In particular, cold gas spraying is suitable.

Owing to the layer arrangement 20 having the magnetic layers 27, 31, the electrical connecting path 24 can act on the operating current 14 as the inductance 16, that is to say can act like an electrical coil or an inductor having a prescribed inductance value.

Figure 4:
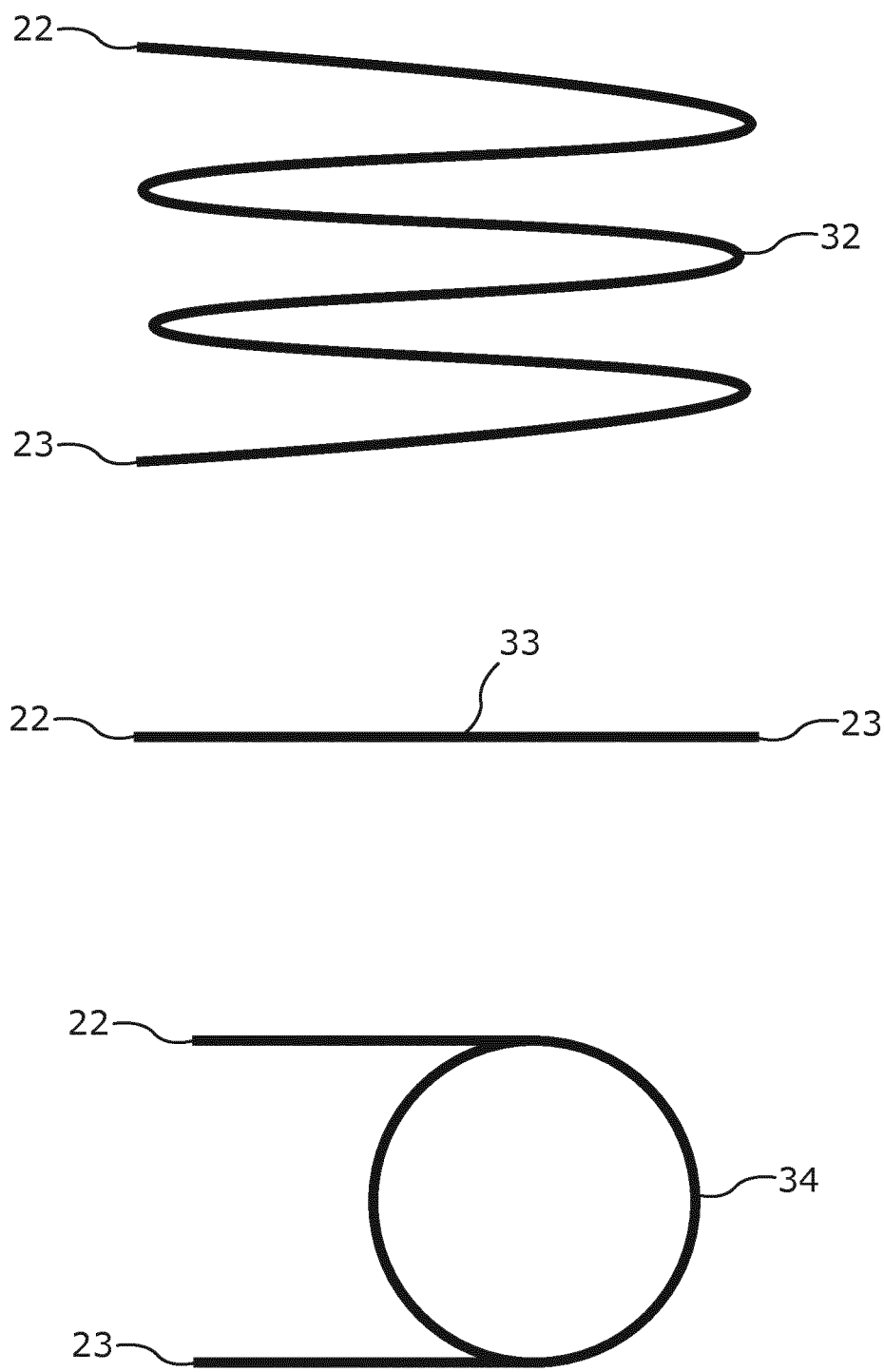
FIG. 4 shows a sketch to illustrate possible shapes of an electrical connecting path, which can be formed by the circuit arrangement.

FIG. 4 shows by way of example possible shapes of the connecting path 24, namely a meander shape 32, a straight conductor 33 and a plan view of a three-dimensional winding shape, that is to say a helix 34. In this case, the helix 34 has to be produced as multiple repetition or as stacking of the layer arrangement 20. The shape influences the inductance value. The inductance 16 is applied and shaped by said coating method. To this end, the magnetic layer 27 made of a magnetically highly permeable material, that is to say a soft-magnetic material, is applied to the heat sink 17, that is to say the surface thereof made from aluminum or another metal. In order to set the inductance value, a shape of the magnetic layer 27 can be stipulated by means of a pattern or mask. In other words, the magnetic layer 27 forms a strip arranged on the surface 21 or a ribbon.

An electrically insulating insulation layer 28, which can be provided, for example, based on a ceramic or aluminum oxide as material for the electrical insulation, is applied to the magnetic layer 27. The insulation layer 28 does not cover the magnetic layer at the edges completely but only partly in a transverse direction 35 transverse to the direction of the course of the connecting path 24. An electrically conductive conductor layer 29, which can carry the operating current 14 as a continuous current and which can withstand peak currents up to a prescribed current value undamaged in the case of corresponding heat transfer and cooling in the heat sink 17, is applied to the insulation layer 27. The conductor layer 29 likewise covers the insulation layer 28 only partly in the transverse direction 25 so that a step is formed at the edges.

A further electrically insulating second insulation layer 30, which fully covers the two layers lying below said second insulation layer, that is to say the conductor layer 29 and the first insulation layer 28, is applied to the conductor layer 29 so that a connection 36 is produced between the two insulation layers 28, 30. As a result thereof, the conductor layer 29 is completely surrounded by electrically insulating material in cross section. As a result thereof, galvanic isolation with respect to the magnetic layers 27 and 31 is ensured. Furthermore, creepage paths toward the surface 21 and toward the magnetic layer 27 can be designed to be shorter than with a spacing formed exclusively by air.

The layer arrangement 20 is closed off or bounded toward the outside by a further magnetically highly permeable magnetic layer 31, which is connected to the bottommost magnetic layer 27 by overlap 37. The two magnetic layers 27, 31 therefore form a closed magnetic circuit 38, which, in cross section, encloses or surrounds the conductor layer 29. A planar or flat inductance, which, owing to the flat shape, can be cooled by means of the heat sink 17, is therefore provided by the layer arrangement 20.

The application of the respective material of the layers 27, 28, 29, 30, 31 is carried out by means of a cold gas method. In this case, the layer arrangement 20 may be arranged on the same heat sink 17 together with electrical components, for example circuit breakers or transistors of the high-current load 11. By providing a further conductor layer in the layer arrangement 20 (not illustrated), a transformer can also be produced. An even, planar, thermal link of the inductance 16 to the heat sink 17 is produced. Stray fields in the environment 39 of the layer arrangement 20 are reduced owing to the closed magnetic circuit 38. The electromagnetic compatibility (EMC) is therefore improved.

Owing to a porous or granular structure of the magnetic layers 27, 31 that can be set by means of the cold gas spraying, a dedicated or locally concentrated air gap for setting the inductance 16 is not necessary. In addition, cooling or heat dissipation is possible so that, in particular, temperatures of the conductor layer 29 above a maximum value are avoided. By arranging the high-current load 11 and the inductance 16 on the same surface 21, electrical linking by means of the bridge elements 26 with a spacing of less than 10 cm is also possible without this leading to an undesired thermal coupling. Instead of an inverter, a DC/DC converter or DC voltage converter can also be provided, for example, as high-current load 11. The inductance 16 can be provided for a buck converter or boost converter or as a filter for reducing a ripple of a time profile of a current intensity.

LIST OF REFERENCE SIGNS

10 Motor vehicle
11 High-current load
12 Electric machine
13 Voltage source
14 Operating current
15 Circuit arrangement
16 Fusible link
17 Heat sink
18 Cooling channel
19 Cooling medium
20 Layer arrangement
21 Surface
22 Connection region
23 Connection region
24 Connecting path
25 Material cutout 26 Bridge element
27 First magnetic layer
28 First insulation layer
29 Conductor layer
30 Second insulation layer
31 Second magnetic layer
32 Meander shape
33 Straight line
34 Helix
35 Transverse direction
36 Connection
37 Overlap
38 Magnetic circuit
39 Environment

What is claimed is:

1. A circuit arrangement comprising:
   a heat sink; and
   a set of layers arranged on a surface of the heat sink;
   wherein the set of layers includes a first electrically insulating insulation layer and an electrically conductive conductor layer arranged on a side of the first electrically insulating insulation layer facing away from the heat sink;
   wherein the set of layers includes an electrical connecting path between two electrical connection regions;
   a switchable electronic component arranged on the surface of the heat sink, the switchable electronic component electrically interconnected with one of the two electrical connection regions; and
   wherein at least one layer of the set of layers is formed by cold gas spraying of a respective material; and
   between the switchable electronic component and the set of layers, the surface of the heat sink defines two material cutouts and a bridge element formed by a part of the heat sink arranged between the two material cutouts.

2. The circuit arrangement as claimed in claim 1, wherein the set of layers includes:
   a first magnetic layer composed of a magnetic material and arranged between the surface of the heat sink and the first electrically insulating insulation layer to set an electrical inductance value of the connecting path;
   a second insulation layer arranged on a side of the electrically conductive conductor layer facing away from the first electrically insulating insulation layer; and
   a second magnetic layer composed of a magnetic material;
   wherein the conductor layer is arranged between the first magnetic layer and the second magnetic layer.

3. The circuit arrangement as claimed in claim 2, wherein the second magnetic layer is connected to the first magnetic layer along a profile of the electrical connecting path on both sides of the electrical connecting path.

4. The circuit arrangement as claimed in claim 2, wherein the set of layers includes a further insulation layer arranged between the heat sink and the first magnetic layer.

5. The circuit arrangement as claimed in claim 2, wherein the magnetic material of the first magnetic layer and/or of the second magnetic layer is porous.

6. The circuit arrangement as claimed in claim 2, wherein the second insulation layer is connected to the first electrically insulating insulation layer along a profile of the electrical connecting path on both sides of the electrical connecting path.

7. The circuit arrangement as claimed in claim 1, wherein the electrical connecting path comprises a flat coil or a helix.

8. The circuit arrangement as claimed in claim 1, wherein the circuit arrangement comprises a DC voltage converter or an inverter.

9. The circuit arrangement as claimed in claim 1, further comprising a cooling structure in or on the heat sink in order to guide a cooling medium.

10. The circuit arrangement as claimed in claim 2, wherein the first magnetic layer and the second magnetic layer are electrically insulated from one another by at least one of the first electrically insulating insulation layer or the second insulating layer.

11. A motor vehicle comprising:
    an electrical voltage source;
    a high-current load with an operating current greater than 10 A;
    a heat sink; and
    a set of layers arranged on a surface of the heat sink;
    wherein the set of layers includes a first electrically insulating insulation layer and an electrically conductive conductor layer arranged on a side of the first electrically insulating insulation layer facing away from the heat sink;
    wherein the set of layers includes an electrical connecting path between two electrical connection regions;
    a switchable electronic component arranged on the surface of the heat sink, the switchable electronic component electrically interconnected with one of the two electrical connection regions; and
    wherein at least one layer of the set of layers is formed by cold gas spraying of a respective material;
    wherein the voltage source and the high-current load are each connected to a respective one of the two electrical connection regions; and
    between the switchable electronic component and the set of layers, the surface of the heat sink defines two material cutouts and a bridge element formed by a part of the heat sink arranged between the two material cutouts.

12. A method for producing a circuit arrangement, the method comprising:
    producing a set of layers composed of an insulation layer made of an electrically insulating material and a conductor layer made of an electrically conductive material arranged on a side of the insulation layer facing away from a heat sink on a surface of the heat sink by means of cold gas spraying;
    providing an electrical connecting path between two connection regions of the circuit arrangements;
    arranging a switchable electronic component on the surface of the heat sink;
    connecting the switchable electronic component with one of the two electrical connection regions;
    connecting an electrical voltage source and a high-current load to a respective one of the two electrical connection regions, the high-current load having an operating current greater than 10 A; and
    between the switchable electronic component and the set of layers, the surface of the heat sink defines two material cutouts and a bridge element formed by a part of the heat sink arranged between the two material cutouts.

* * * * *